United States Patent [19]

Okabe et al.

[11] Patent Number: 5,719,412
[45] Date of Patent: Feb. 17, 1998

[54] INSULATED GATE BIPOLAR TRANSISTOR

[75] Inventors: Naoto Okabe; Naohito Kato, both of Aichi, Japan

[73] Assignee: Nippondenso Co., Ltd, Kariya-city, Japan

[21] Appl. No.: 544,200

[22] Filed: Oct. 17, 1995

Related U.S. Application Data

[63] Continuation-in-part of Ser. No. 221,002, Apr. 1, 1994, abandoned.

Foreign Application Priority Data

Apr. 2, 1993 [JP] Japan ......................... 5-76759

[51] Int. Cl.⁶ ........................... H01L 29/74; H01L 23/58
[52] U.S. Cl. ........................ 257/139; 257/490; 257/494
[58] Field of Search ............................ 257/139, 147, 257/490, 491, 494

[56] References Cited

U.S. PATENT DOCUMENTS

| | | | |
|---|---|---|---|
| 4,041,517 | 8/1977 | Fuse et al. | 257/256 |
| 4,803,532 | 2/1989 | Mihara | 257/139 |
| 4,972,239 | 11/1990 | Mihara | 257/139 |
| 4,985,741 | 1/1991 | Bauer et al. | 257/139 |
| 4,985,743 | 1/1991 | Tokura | 257/139 |
| 4,994,871 | 2/1991 | Chang et al. | 257/139 |
| 5,043,779 | 8/1991 | Nishimura | 257/139 |
| 5,095,343 | 3/1992 | Klodzinski et al. | 257/408 |
| 5,510,634 | 4/1996 | Okabe et al. | 257/139 |

FOREIGN PATENT DOCUMENTS

| | | |
|---|---|---|
| A080044 | 6/1983 | European Pat. Off. . |
| 156022 | 8/1986 | European Pat. Off. . |
| 293846 | 12/1988 | European Pat. Off. . |
| A416805 | 3/1991 | European Pat. Off. . |
| 0503605 | 9/1992 | European Pat. Off. . |
| 501342 | 9/1992 | European Pat. Off. . |
| 4022021 | 1/1991 | Germany . |
| 64-54765 | 8/1987 | Japan . |
| 2112285 | 10/1988 | Japan . |
| 64-81270 | 3/1989 | Japan . |
| 3-44969 | 6/1989 | Japan . |
| 4283968 | 10/1992 | Japan . |
| 2240427 | 7/1991 | United Kingdom . |
| 9103842 | 3/1991 | WIPO . |

OTHER PUBLICATIONS

Muller et al. "Device Electronics for IC's," p. 204, 1986
Laska et al. "A 2000 V Non-Punchthrough IGBT with High Ruggedness", Solid-State Electronics vol. 35, No. 5, pp. 681–685 no date.

*Primary Examiner*—Wael Fahmy
*Attorney, Agent, or Firm*—Cushman, Darby & Cushman IP Group of Pillsbury, Madison & Sutro LLP

[57] ABSTRACT

The insulated gate bipolar transistor (IGBT) integrates the anti-excess voltage protection function and a drain voltage fixing function. When a voltage is applied across the drain electrode and the source electrode of the IGBT, a depletion zone propagates from a p-n junction between a p base layer and a n⁻ drain layer toward inside of the n⁻ drain layer. A critical electric field is also established, causing generation of a great number of electron-hole pairs due to impact ionization of carriers in or near the n⁻ drain layer. Conduction exist between the drain electrode and the source electrode, at an applied voltage lower than a drain-source voltage at which the depletion region reaches a p⁺ drain layer through the n⁻ drain layer, the applied voltage being equal to or lower than a critical voltage that causes generation of a great number of electron-hole pairs due to impact ionization of carriers in or near the n⁻ drain layer below a p-n junction between a p-type guard ring and the n⁻ drain layer.

14 Claims, 4 Drawing Sheets

INSULATED GATE BIPOLAR TRANSISTOR

CROSS-REFERENCE TO RELATED APPLICATIONS

This is a continuation-in-part application of application Ser. No. 08/221,002, filed Apr. 1, 1994, now abandoned, the contents of which are incorporated herein by reference.

BACKGROUND OF THE INVENTION

1. Field of the Invention

The present invention relates to an insulated gate bipolar transistor (hereinafter referred to as "IGBT") integrating an anti-excess voltage protection function and a drain voltage fixing function.

2. Description of the Related Art

Upon turning OFF a power switching element employed as an inverting device for a motor circuit or non-interruptible power supply circuit, a high voltage can be induced in an inductive load or a floating inductance in the circuit due to the abrupt change of current flowing through the circuit. This high voltage is applied to the power switching element as a spike of voltage. It causes fatigue or breakage of the power switching element. To protect the power switching element from excess voltage, a voltage clamp circuit including a constant voltage diode is employed. That voltage clamp circuit operates based on the principle of avalanche breakdown. It turns ON the constant voltage diode before breakdown occurs in the power switching element because of an applied spike of voltage and thus fixes the maximum level of the spike of voltage within a safe operation range.

When an IGBT is employed as the power switching element, a similar means can be applied. Namely, the constant voltage diode is externally connected between the drain and gate of the IGBT element. However, this increases both the cost of assembly and the overall device size. It is also possible to deposit a layer of polycrystalline silicon on a substrate in which an IGBT element has been formed, and a constant voltage diode is then formed in this polycrystalline silicon layer integrally with the IGBT element. This increases the number of photo-masks necessary in the element fabrication process leading to an increase in the production cost. Furthermore, in order to form the constant voltage diode on the surface of the IGBT element, it is necessary either to reduce the area of the cell region or to increase the chip dimensions.

As a solution to this problem, Japanese Unexamined Patent Publication (Kokai) no. 64-81270 proposes a method of integrating a constant voltage diode, in which a constant voltage diode based on the principle of avalanche breakdown is incorporated in the IGBT element so that the constant voltage diode is interposed between the drain and the source in an equivalent circuit. This solves the problems such as the reduction of the chip area of the IGBT element.

Figure 1:
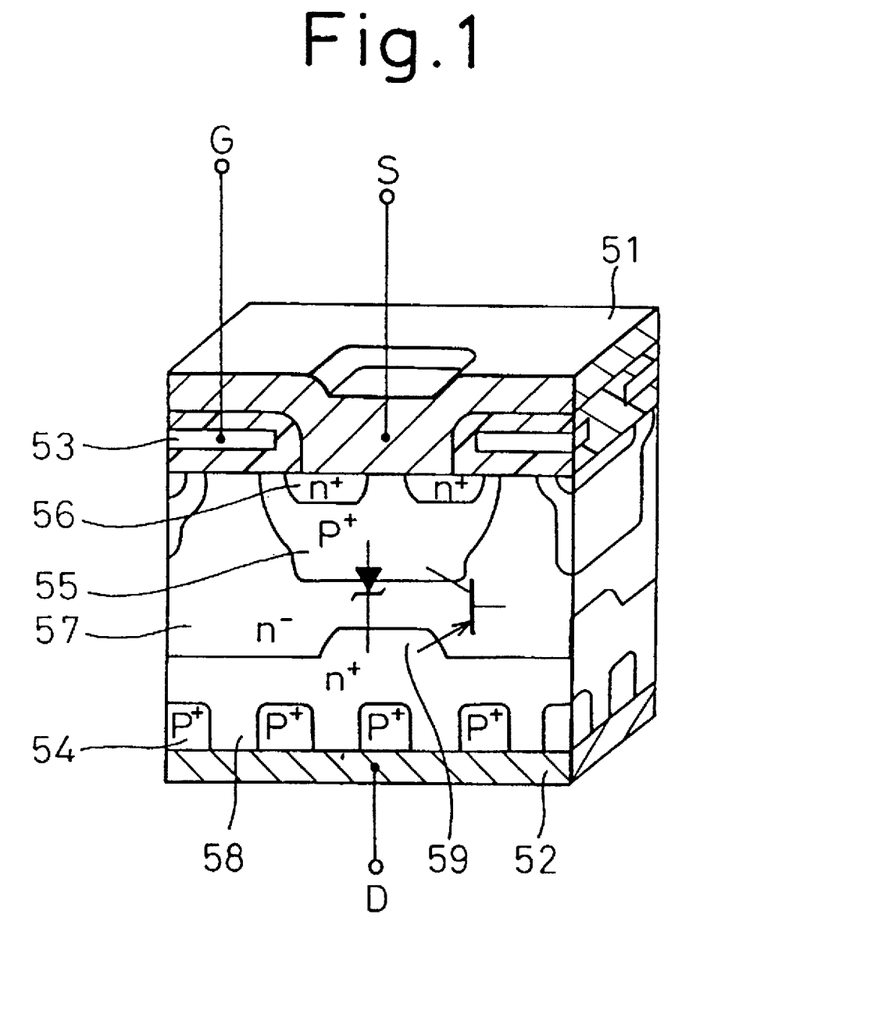
FIG. 1 shows a conventional IGBT integrating therein a constant voltage diode operating based on the principle of avalanche breakdown, in a perspective view of a partial section.

The proposed method provides a construction as shown in FIG. 1, including a source electrode 51, a drain electrode 52 and a gate electrode 53. The upper portion of the construction is composed of an insulating gate having a DSA (diffused self-aligned) structure, a $p^+$ base layer 55, and an $n^+$ source layer 56, thereby forming a p-type channel immediately below the gate. It can also be seen that the construction has a vertical npnp-lamination of four layers, i.e., the $n^+$ source layer 56, the $p^+$ base layer 55, an $n^-$ drain layer 57, and a $p^+$ drain layer 54 located between an $n^+$ layer 58 and the drain electrode 52.

The $p^+$ drain layer 54, on the side of the drain electrode 52, is divided into small segments forming a honeycomb-like array, to provide a structure in which a vertical pnp transistor having the collector and the emitter between which a p-n junction diode is connected in parallel. The diode has a portion 59 of the $n^+$ layer that protrudes into the $n^-$ layer 57 to be close to the $p^+$ layer 55, to provide avalanche type constant voltage diode characteristics, thereby protecting the IGBT element from excess voltage.

To incorporate the constant voltage diode, the proposed construction must have an $n^+$ layer 58 on the drain side thereof. The presence of the $n^+$ layer 58 suppresses hole injection from the drain side upon conducting the IGBT element and thereby causes the ON voltage to be increased.

Moreover, the construction is complicated because of the honeycomb structure of the $p^+$ layer 54 on the side of the drain electrode 52 and because of the portion 59 of the $n^+$ layer 58 that protrudes into the $n^-$ drain layer 57. This raises both the wafer and production costs.

SUMMARY OF THE INVENTION

In view of the conventional problems described above, the object of the present invention is to provide an IGBT element that incorporates an anti-excess voltage protection and a drain voltage-fixing function together with a function to clamp the drain-source voltage in a monolithic structure without the drawback of increasing the ON voltage.

To achieve this object, without incorporating a constant voltage diode in an IGBT element as conventionally employed, the present inventors propose a structure such that conduction between drain and source electrodes is effected by a breakdown induced in a triple layer structure composed of a base layer of the IGBT element, a drain layer of low impurity concentration and a drain layer of high impurity concentration under a condition suitable for clamping the drain-source voltage.

Specifically, the present invention provides an insulated gate bipolar transistor, comprising:

a first semiconductor layer of a first conductivity type;

a second semiconductor layer of a second conductivity type adjoining the first semiconductor layer;

a third semiconductor layer of the first conductivity type formed in the second semiconductor layer, with a junction between the second semiconductor layer and the third semiconductor layer terminating at a surface of the second semiconductor layer;

a fourth semiconductor layer of the second conductivity type formed in the third semiconductor layer, with a junction between the third semiconductor layer and the fourth semiconductor layer terminating at a surface of the third semiconductor layer;

a fifth semiconductor layer of the first conductivity type formed in the second semiconductor layer to surround a region in which the third semiconductor layer is formed, with a junction between the second semiconductor layer and the fifth semiconductor layer terminating at a surface of the second semiconductor layer;

a sixth semiconductor layer of the first conductivity type formed in the second semiconductor layer without any semiconductor layers of the second conducting type formed therein, a junction between the second semiconductor layer and the sixth semiconductor layer terminating at the surface of the second semiconductor layer, the sixth semiconductor layer being located between the fifth semiconductor layer and the third semiconductor layer;

a gate electrode formed, via a gate insulating film, at least over a channel region provided by a surface of the third semiconductor layer in a portion between the second semiconductor layer and the fourth semiconductor layer;

a source electrode in a contact with both of the third semiconductor layer and the fourth semiconductor layer; and a drain electrode for supplying a drain current through the first semiconductor layer;

the second semiconductor layer of the second conductivity type having an impurity concentration and a layer thickness such that, when a voltage is applied across the drain electrode and the source electrode to propagate a depletion zone from a p-n junction surface between the third semiconductor layer of the first conductivity type and the second semiconductor layer of the second conductivity type toward the inside of the second semiconductor layer, a critical electric field is established that causes generation of a great number of electron-hole pairs due to impact ionization of carriers in or near the second semiconductor layer of the second conductivity type, thereby causing conduction between the drain electrode and the source electrode, at an applied voltage lower than a drain-source voltage at which the depletion region reaches the first semiconductor layer through the second semiconductor layer, the applied voltage being equal to or lower than a critical voltage that causes generation of a great number of electron-hole pairs due to impact ionization of carriers in or near the second semiconductor layer of the second conductivity type below a p-n junction between the fifth semiconductor layer of the second conductivity type.

Preferably, the insulated gate bipolar transistor according to the present invention further comprises a seventh semiconductor layer of the second conductivity type which is disposed at or near a p-n junction between the first semiconductor layer and the second semiconductor layer, has an impurity concentration higher than that of the second semiconductor layer, and is patterned so as to leave a contact surface between the first semiconductor layer and the second semiconductor layer for transferring carriers therethrough.

DESCRIPTION OF THE PREFERRED EMBODIMENTS

The operation of the IGBT according to the present invention will be described, particularly concerning an n-channel IGBT.

When a positive voltage is applied to a drain electrode relative to a source electrode, a p-n junction defined between an n-type second semiconductor layer and a p-type third semiconductor layer is brought into a reverse biased condition, so that a depletion region propagates from this p-n junction. When the n-type second semiconductor layer has a lower impurity concentration in comparison with the p-type third semiconductor layer, the depletion region propagates through the n-type second semiconductor layer toward the p-type first semiconductor layer, as the applied voltage between the source and drain electrodes increases. The electrical field in the depletion region also increases with the increase in the source-drain voltage.

When the electrical field reaches a critical value which causes generation of a great number of electron-hole pairs in the depletion region by impact ionization, the thus-generated holes flow through the p-type third semiconductor layer to the source electrode while the generated electrons flow toward a p-n junction defined between the p-type first semiconductor layer and the n-type second semiconductor layer. This reduces a potential barrier formed by a diffusion potential at this p-n junction, so that holes or minority carriers from the p-type first semiconductor layer are injected into the n-type second semiconductor layer, pass through the depletion region and the p-type third semiconductor layer, and flow to the source electrode. When passing through the depletion region, the holes are accelerated by the electrical field in the depletion region to obtain a large kinetic energy, thereby further generating new electron-hole pairs due to impact ionization.

With the mechanism as described above, a current abruptly begins to flow between the source electrode and the drain electrode to suppress an increase in the voltage between the source electrode and the drain electrode. This is known as a breakdown phenomenon in the bipolar transistor that occurs because the maximum electrical field, established near the base-collector p-n junction when the base electrode is open, reaches a critical electrical field. The present invention applies this phenomenon to the IGBT.

The voltage $V_{BDS}$ between the source electrode and the drain electrode, at which the current abruptly begins to flow, is an applied voltage at which the electrical field in the IGBT element reaches a critical electrical field that causes the breakdown phenomenon. It has been found that the $V_{BDS}$ value depends on the impurity concentration $N_{DND}$ of the n-type second semiconductor layer and that the smaller the $N_{DND}$, the greater the $V_{BDS}$. Therefore, the voltage $V_{BDS}$ can be set to desired values by selecting the $N_{DND}$ value of the second semiconductor layer. Namely, the IGBT element is protected from excess voltage by setting the impurity concentration of the n-type second semiconductor layer to a selected value such as to provide a $V_{BDS}$ value falling within a safe operation range of the element. Additionally, like the third semiconductor layer, a p-type sixth semiconductor layer is located on a portion of the upper surface of the second semiconductor layer. However, the sixth semiconductor layer does not include a fourth semiconductor layer. The sixth semiconductor layer is located between the p-type third semiconductor layer, the source electrode extending to a location above the sixth semiconductor layer. The source electrode does not extend above the fifth semiconductor layer which is generally at a floating potential.

An increased electric field arises in a depletion layer formed near the p-n junction between the second semiconductor layer and the sixth semiconductor layer. When the critical value is reached, this increased electric field generates a localized avalanche breakdown from which a concentrated breakdown current flows through p-layer 7A. Thereafter, avalanche breakdown is experienced by the entire cell so that the concentrated breakdown current is dispersed by the cell to avoid thermal breakdown.

Because of the accompanying rapid increase in the drain current, the source-drain voltage is fixed at or near a particular voltage. Thus, the IGBT structure according to the present invention internally incorporates the function for preventing the source-drain voltage from rising above a given value while fixing the source-drain voltage within a particular range.

Preferably, the IGBT element according to the present invention further comprises, as the secondary feature, an n-type seventh semiconductor layer which is disposed at or near a p-n junction between the p-type first semiconductor layer and the n-type second semiconductor layer. The seventh semiconductor layer has an impurity concentration higher than that of the second semiconductor layer, and is patterned so as to leave a contact surface between the first semiconductor layer and the second semiconductor layer for transferring carriers therethrough. This feature advantageously restricts injection of the minority carriers (holes) from the p-type first semiconductor layer into the n-type second semiconductor layer through the p-n junction therebetween when a large number of electron-hole pairs are generated, thereby restricting the formation of a conductivity modulated region and the reduction of resistance due to the injection of the holes. As a result, when the drain current rises, fluctuation of drain voltage because of conductivity modulation, caused by an injection of minority carriers, can be suppressed to stabilize the drain voltage when the current begins to flow through the element.

Thus, the present invention uses the operation principle that the second semiconductor layer has an impurity concentration set at a selected value to induce a breakdown in a vertically laminated triple layer structure composed of third, second and first semiconductor layers in an IGBT element under a condition suitable for clamping the drain-source voltage. This makes it unnecessary to incorporate a constant voltage diode in an IGBT element, in contrast with the conventional IGBT structure. Therefore, the present invention is advantageous over the conventional art in that the IGBT element incorporates an anti-excess voltage protection function and a drain voltage fixing function together with a drain-source voltage clamping function in a monolithic structure, without causing an increase in the ON voltage.

The present invention will now be described in more detail by way of examples for an n-channel IGBT employing p- and n-types as the first and second conductivity types, respectively.

EXAMPLE 1

Figure 2:
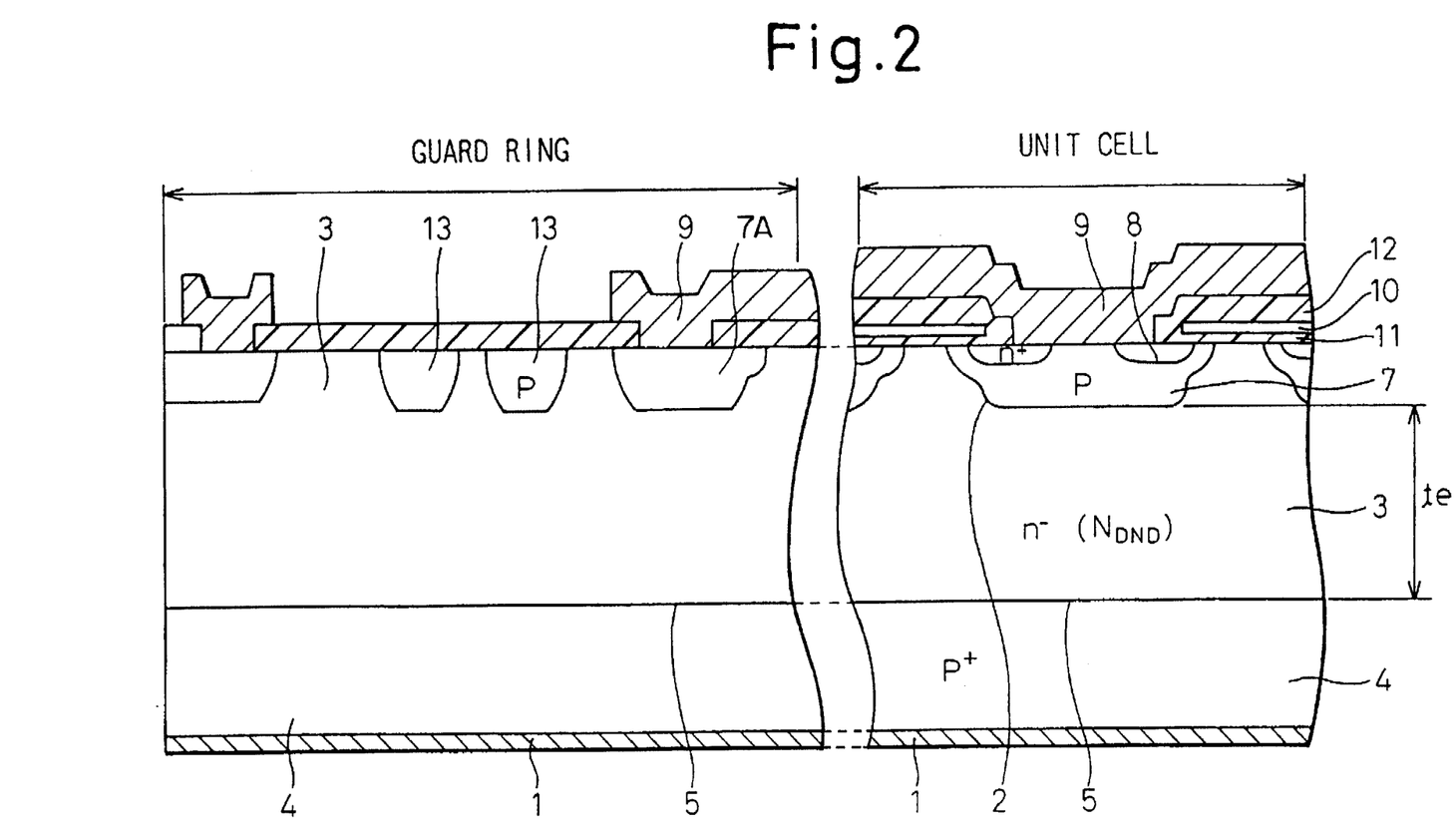
FIG. 2 shows a unit cell portion and a circumferential guard ring portion of an IGBT according to a preferred embodiment of the present invention, in a sectional view.

FIG. 2 shows a unit cell portion and a circumferential guard ring portion of an IGBT according to the first embodiment of the present invention, the guard ring surrounding the unit cell. The IGBT is fabricated in the following process.

First, a semiconductor substrate of a $p^+$ drain layer 4 (first semiconductor layer) is prepared. A high resistivity $n^-$ drain layer 3 (second semiconductor layer) with a selected impurity concentration $N_{DND}$ and layer thickness $t_e$ is then formed by vapor deposition on other vapor phase growth process. A p base layer 7 (third semiconductor layer), a p-layer 7A (sixth semiconductor layer), and a p layer 13 (fifth semiconductor layer) are simultaneously formed to a depth of 3 to 6 μm by a selective diffusion process. The p layer 13 is a guard ring to provide high breakdown voltage. An $n^+$ source layer 8 (fourth semiconductor layer) is formed in the p base layer 7 by selective diffusion process. Source layer 8 is not provided in p-layer 7A. It should be noted that, during the above-mentioned forming process, the $n^-$ drain layer 3 is oxidized in the surface portion to form a gate oxide film 11, on which a gate electrode 10 is then formed. The gate electrode 10 is used as a mask for forming the p base layer 7 and an $n^+$ source layer 8 in a self-aligning manner by a DSA (Diffusion Self-Alignment) process to provide a channel region. Thereafter, an interlayer insulation layer 12 is formed. Subsequently, to provide an ohmic contact in the p base layer 7 and the $n^+$ source layer 8, contact holes are opened through the gate oxide layer 11 and the interlayer insulation layer 12. Deposition of several μm of aluminum and selective etching are then performed to form a source electrode 9 and a not-shown gate electrode pad. Then, a metal film is deposited on the reverse side of the semiconductor substrate or $p^+$ drain layer 4 to form a drain electrode 1.

The $n^-$ drain layer 3 has an impurity concentration $N_{DND}$ and a layer thickness $t_e$ such that breakdown occurs in the triple layer structure composed of the p base layer 7, the $n^-$ drain layer 3 and the $p^+$ drain layer 4 at a voltage equal to or smaller than a source-drain proof voltage $V_{GR}$ determined by the structure of the circumferential guard ring.

Specifically, the $n^-$ layer 3 (second semiconductor layer of the second conductivity type) has an impurity concentration and a layer thickness such that, when a voltage is applied across the drain electrode 1 and the source electrode 9 to propagate a depletion zone from the surface of a p-n junction 2 between the p base layer 7 (third semiconductor layer of the first conductivity type) and the $n^-$ layer 3 (second semiconductor layer) toward inside of the $n^-$ layer 3 (second semiconductor layer), a critical electric field is established that causes generation of a great number of electron-hole pairs due to impact ionization of carriers in or near the $n^-$ layer 3 (second semiconductor layer). The generation of electron-hole pairs causes conduction between the drain electrode 1 and the source electrode 9, at an applied voltage lower than a drain-source voltage at which the depletion region reaches the $p^+$ drain layer (first semiconductor layer of the first conductivity type) through the $n^-$ layer 3 (second semiconductor layer). The applied voltage is equal to or lower than a critical voltage that causes generation of a great number of electron-hole pairs due to impact ionization of carriers in or near the $n^-$ layer 3 (second semiconductor layer) below a p-n junction between the p layer or guard ring 13 (fifth semiconductor layer of the first conductivity type) and the $n^-$ layer 3 (second semiconductor layer).

The thus fabricated IGBT has an anti-excess voltage protection function and a drain voltage fixing function, as described in detail below.

When a positive voltage $V_D$ is applied to the drain electrode 1 while maintaining the potential at the source electrode 9 and the gate electrode 10 on the ground level, a depletion region is formed in the $n^-$ drain layer 3 because of reverse bias at the p-n junction 2 defined between the p base layer 7 and the $n^-$ drain layer 3 toward the $p^+$ drain layer 4 as the voltage $V_D$ increases. The electrical field in the depletion region also increases with the increase in the source-drain voltage.

When the electrical field reaches a critical value $E_B$ which causes generation of a great number of electron-hole pairs in the depletion region by impact ionization, the thus-generated holes flow through the p base layer 7 to the source electrode 9 while the generated electrons flow toward a p-n junction 5 defined between the $p^+$ drain layer 4 and the $n^-$ drain layer 3. This reduces a potential barrier formed by a diffusion potential at this p-n junction, so that holes or minority carriers from the $p^+$ drain layer 4 are injected into the $n^-$ drain layer 3, pass through the depletion region and the p base layer, and flow to the source electrode 9. When passing through the depletion region, the holes are accelerated by the electrical field in the depletion region to obtain a large kinetic energy, thereby further generating new electron-hole pairs due to impact ionization.

With the mechanism as described above, breakdown phenomenon for the entire cell unit is induced by the p-n-p triple layer structure composed of the p base layer 7, the $n^-$ drain layer 3 and the $p^+$ drain layer 4, so that a current abruptly begins to flow between the source electrode 9 and the drain electrode 1 to suppress an increase in the voltage between the source electrode 9 and the drain electrode 1.

P-type layer 7A is located on an upper surface portion of n-type layer 3, separating base layer 7 from guard rings 13; it does not include a n-type source layer 8 on its upper surface. Source electrode 8 extends above and contacts p-type layer 7A. A p-type layer 7A is used to lower the critical voltage at which this avalanche breakdown occurs. Since layer 7A does not include a source layer 8, the potential of layer 7A is not increased by a breakdown current formed between itself and source layer 8. Thus, the difference in potential between source electrode 9 and layer 7A is not used to turn ON an n-p-n transistor such as those composed by source layer 8, p-layer 7 and n-layer 3. Rather, the difference in potential between source electrode 9 and layer 7A is used to turn ON a p-n-p transistor formed between p-layer 7A, n-layer 3, and p-layer 4. The breakdown current is then dispersed to the entire cell region including n-layer 3 and p-layer 4.

When the positive voltage $V_D$ is applied to drain electrode 1 relative to the source electrode 8, an increased electric field arises in a depletion layer formed next to guard ring 13 near the p-n junction between n-type layer 3 and p-type layer 7A. This increased electric field increases the likelihood of a localized avalanche breakdown at the location. Once the localized avalanche breakdown occurs at that location a concentrated breakdown current flows through p-layer 7A. Thereafter, an avalanche breakdown is experienced by the entire cell to allow the concentrated breakdown current to be dispersed by the entire cell, thereby avoiding thermal breakdown while lowering the voltage for cell unit breakdown.

Because of the accompanying rapid increase in the drain current, the source-drain voltage is fixed at or near a particular voltage $V_{BDS}$ as hereinbefore described, so that a drain voltage fixing function is provided.

The breakdown operation for the cell unit, which is performed by the p-n-p triple layer structure composed of the p base layer 7, the $n^-$ drain layer 3 and the $p^+$ drain layer 4, is qualitatively interpreted by the breakdown effected between the emitter and the collector of a pnp bipolar transistor with the base terminal opened.

The breakdown voltage $V_{BDS}$ is expressed by the following formula (1) in terms of the avalanche breakdown voltage $V_{Bpn}$ of a p-n junction defined by the p base layer 7 and the $n^-$ drain layer 3 (e.g., the p-type collector and the n-type base in a pnp bipolar transistor) and the current amplification factor $h_{FE}$ of a pnp triple layer bipolar transistor.

$$V_{BDS}=V_{Bpn}/(h_{FE})^{1/n} \quad (1)$$

where "n" is a constant which depends on the material and structure.

In a p-$n^-$ junction in the form of a one-sided step junction, the avalanche breakdown voltage $V_{Bpn}$ of the p-n junction is expressed by the following formula (2) in terms of the specific dielectric constant (permittivity) $K_S$ of the material, the dielectric constant of vacuum $\epsilon_0$, the critical electric field $E_{CRIT}$ at which the avalanche breakdown occurs, the electric charge of an electron Q, and the impurity concentration $N_{DND}$ Of the $n^-$ drain layer 3.

$$V_{Bpn}=K_S X \epsilon_0 X E_{CRIT}^2/(2 \times q \times N_{DND}) \quad (2)$$

Substituting formula (2) into formula (1) yields the following formula (3).

$$V_{BDS}=K_S X \epsilon_0 x E_{CRIT}^2/(2 \times q \times N_{DND}) \times (h_{FE})^{1/n} \quad (3)$$

This shows that the breakdown voltage $V_{BDS}$ is determined by the impurity concentration $N_{DND}$ and the current amplification constant $h_{FE}$.

The $H_{FE}$ value depends on the layer thickness $t_e$ and impurity concentration $N_{DND}$ of the $n^-$ drain layer 3, which corresponds to the base region of a pnp triple layer bipolar transistor.

Therefore, the breakdown voltage $V_{BDS}$ of a pnp triple layer structure composed of the p base layer 7, the $n^-$ drain layer 3 and the $p^+$ drain layer 4 can be set to a desired value not higher than the source-drain proof voltage determined by the circumferential guard ring structure surrounding the unit cell, by selecting the impurity concentration $N_{DND}$ and layer thickness $t_e$ of the $n^-$ drain layer 3.

The present invention has the following advantageous effect. The impurity concentration $N_{DND}$ and layer thickness $t_e$ of the $n^-$ drain layer 3 is selected so as to cause breakdown to occur in the unit cell region at a voltage not higher than $V_{GR}$. It should be also noted that, when the electrical field $E_U$ of the unit cell region is either equal to, or a little greater than, the electrical field $E_{GR}$ of the guard ring region, the high electrical field region of the unit cell has an area greater than that of the high electrical field region of the guard ring, with respect to a plan view of a device chip, so that the unit cell region has a large number of impact-ionized carriers to allow a large electrical current to flow therethrough such that substantial electrical conduction is effected by the breakdown of the unit cell. This makes it possible that the circumferential portion of a unit cell has a higher proof voltage than the core portion of the unit cell to realize a high proof voltage IGBT. It should be also appreciated that breakdown does not occur in the guard ring portion but occurs in the unit cell region, so that the occurrence of breakdown is not limited to near the guard ring portion as was conventionally encountered, and therefore an excess voltage can be absorbed in a broad cell region over the whole chip area. As a result, the current flowing through the chip upon breakdown is made uniform, so that the occurrence of hot spots or other problems are eliminated.

EXAMPLE 2

Figure 3:
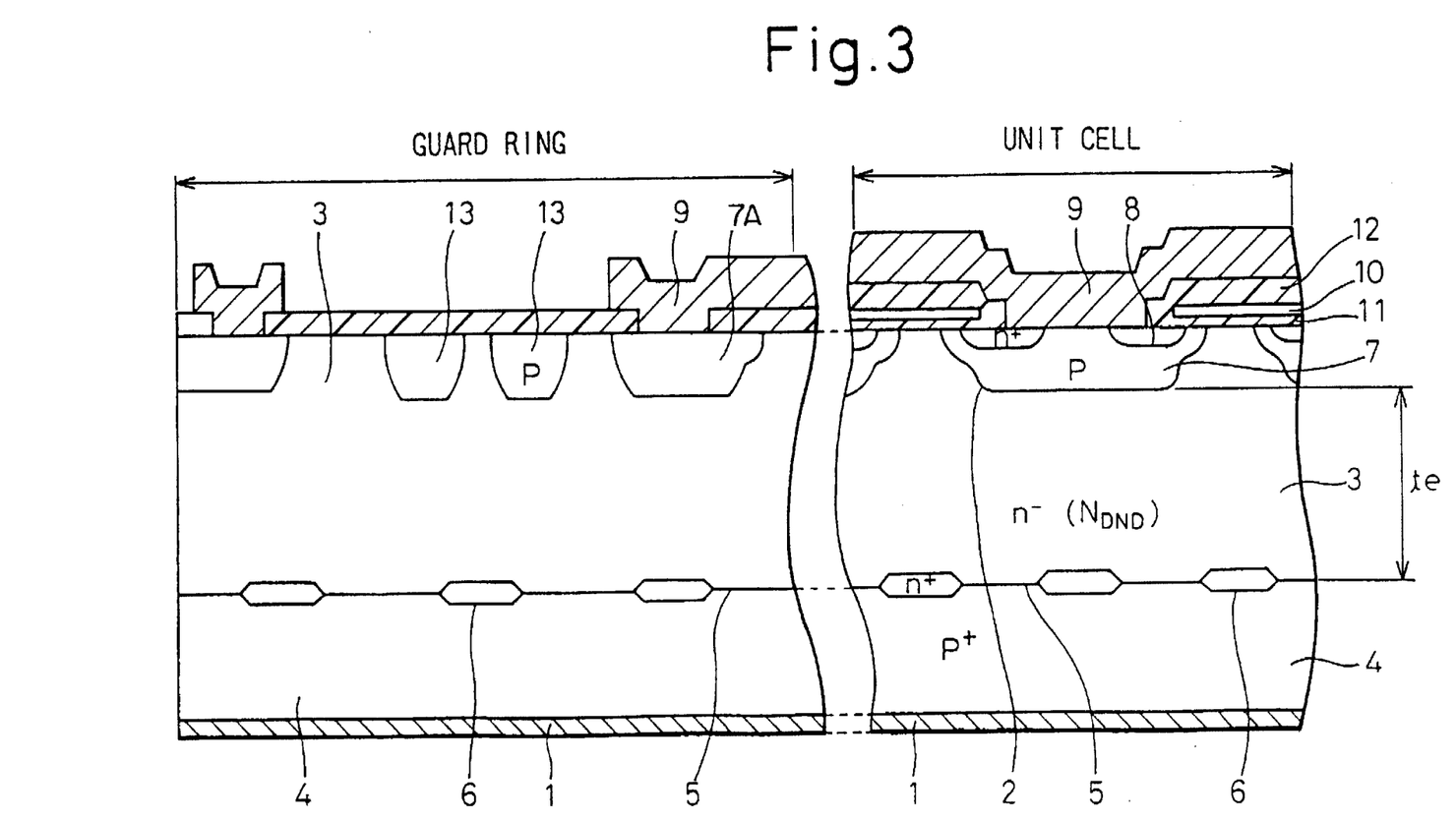
FIG. 3 shows a unit cell portion and a circumferential guard ring portion of an IGBT according to another preferred embodiment of the present invention, in a sectional view.

FIG. 3 shows a unit cell portion and an outer circumferential guard ring portion of an IGBT according to another preferred embodiment of the present invention, in a sectional view. This IGBT has the same structure as that of Example 1, except that an $n^+$ layer 6 (seventh semiconductor layer) in the form of a periodic repeated pattern of stripes is selectively formed near the substrate p-n junction 5. The $n^+$ layer 6 can be formed near the substrate p-n junction 5, either by selective diffusion of an n-type impurity into the surface of the semiconductor substrate or $p^+$ drain layer 4 followed by selective diffusion of an n-type impurity into the surface of the $n^-$ layer, prior to the step of forming the $n^-$ drain layer 3 and the subsequent process steps as described in Example 1. In FIG. 3, the corresponding components are denoted by the same reference numerals as those in FIG. 2.

The thus-fabricated IGBT has an excess-drain voltage protection function and a drain voltage fixing function, as described in detail below.

When a positive voltage $V_D$ is applied to the drain electrode 1 while maintaining the potential at the source electrode 9 and the gate electrode 10 at ground level, a depletion region is formed in the n⁻ drain layer 3 because of reverse bias at the p-n junction 2 defined between the p base layer 7 and the n⁻ drain layer 3. This depletion region propagates within the n⁻ drain layer 3 toward the p⁺ drain layer 4 as the voltage $V_D$ increases. The electrical field in the depletion region also increases with the increase in the source-drain voltage.

When the electrical field reaches a critical value $E_B$ which causes generation of a great number of electron-hole pairs in the depletion region by impact ionization, the thus-generated holes flow through the p base layer 7 to the source electrode 9 while the generated electrons flow toward a p-n junction 5 defined between the p⁺ drain layer 4 and the n⁻ drain layer 3. This reduces a potential barrier formed by a diffusion potential at this p-n junction, so that holes or a minority carrier from the p⁺ drain layer 4 are injected into the n⁻ drain layer 3, pass through the depletion region and the p base layer, and flow to the source electrode 9. When passing through the depletion region, the holes are accelerated by the electrical field in the depletion region to obtain a large kinetic energy, thereby further generating new electron-hole pairs due to impact ionization.

With the mechanism as described above, a breakdown phenomenon for the cell unit is induced by the p-n-p triple layer structure composed of the p base layer 7, the n⁻ drain layer 3 and the p⁺ drain layer 4, so that a current abruptly begins to flow between the source electrode 9 and the drain electrode 1 to suppress an increase in the voltage between the source electrode 9 and the drain electrode 1.

Figure 4:
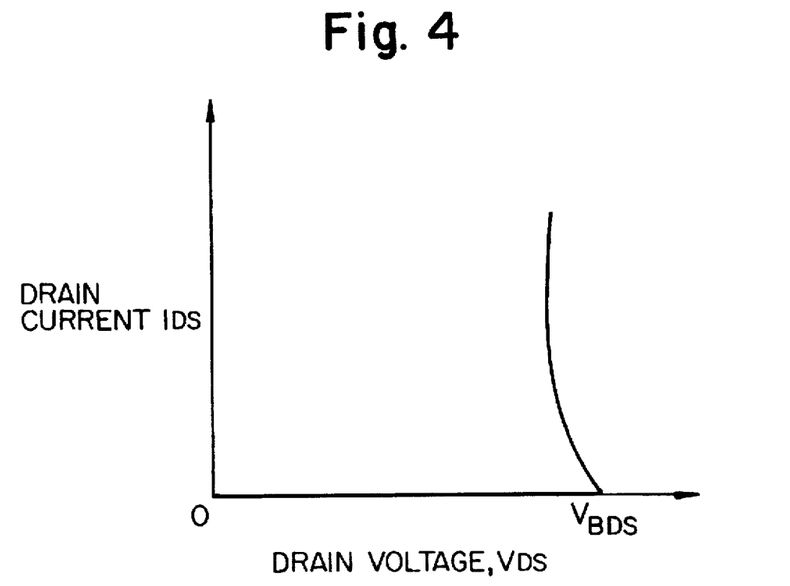
FIG. 4 is a graph showing the electric characteristic of the IGBT shown in FIG. 2.
Figure 5:
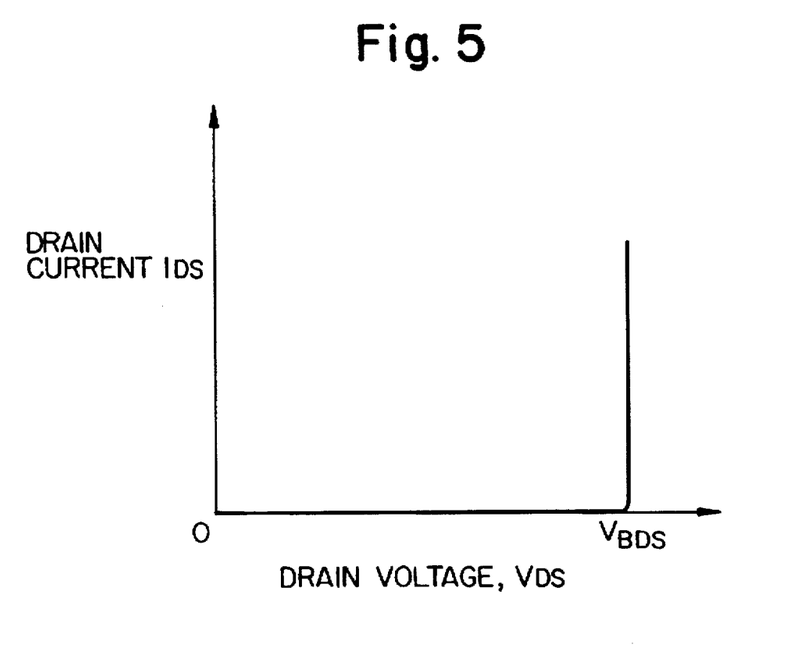
FIG. 5 is a graph showing the electric characteristic of the IGBT shown in FIG. 3.

The breakdown operation is performed by a pnp triple layer bipolar transistor structure composed of the p base layer 7, the n⁻ drain layer 3 and the p⁺ drain layer 4. Therefore, the drain voltage $V_{BDS}$ is varied by the current amplification constant $h_{FE}$ of the pnp triple layer bipolar transistor structure composed of the p base layer 7, the n⁻ drain layer 3 and the p⁺ drain layer 4. Namely, as the current $I_{DS}$ flowing between the drain electrode 1 and the source electrode 9 is increased, the $h_{FE}$ value of the pnp triple layer bipolar transistor structure composed of the p base layer 7, the n⁻ drain layer 3 and the p⁺ drain layer 4 is also increased. The source-drain voltage $V_{DS}$ is reduced with the increase in the source-drain current to exhibit a negative resistance characteristic as shown in FIG. 4, in which the drain voltage $V_{DS}$ is reduced with the increase in the drain current $I_{DS}$.

In contrast, the structure provided with the n⁺ layer 6 as shown in FIG. 3 has an advantage that the number of holes injected from the p⁺ drain layer 4 is restricted, so that the $h_{FE}$ value of the pnp triple layer bipolar transistor structure composed of the p base layer 7, the n⁻ drain layer 3 and the p⁺ drain layer 4 is reduced, thereby reducing the variation of the $h_{FE}$ value in accordance with an increase in the drain current. As a result, the reduction in the $V_{DS}$ is suppressed when the $I_{DS}$ is increased, and thus, the $V_{DS}$ can be fixed more stably.

It is more advantageous that the n⁺ layer 6 has a periodic repeated pattern disposed over the p-n junction 5 to provide a uniform density of the current flowing through the IGBT element.

It should be appreciated that, although FIG. 3 shows an example in which the n⁺ layer 6 is formed at the interface (or p-n junction) 5 between the p⁺ drain layer 4 and the n⁻ drain layer 3, the equivalent effect can be obtained even when the n⁺ layer is formed at a position higher or lower than the interface 5. the pattern of the n⁺ layer 6 is not limited to stripes but may be patterned as a net, for example.

In the foregoing embodiments, the proof voltage of the guard ring can be made comparable to that of the unit cell by selecting the depth and number of the p layer 13. Alternatively, the proof voltage of the unit cell can be also made smaller than that of the guard ring by selectively providing a continuous n⁺ layer 6 near the interface 5 between the n⁻ drain layer 3 and the p⁺ drain layer 4 of the guard ring. This can be interpreted through formula 930 as that the $h_{FE}$ of the pnp bipolar transistor of the unit cell to make the proof voltage of the unit cell higher than the proof voltage of the guard ring.

Although the foregoing embodiments have been described regarding an n channel type IGBT in which the first conductivity type is p-type and the second conductivity type is n-type, the present invention can also be advantageously applied to a p channel type IGBT in which the conductivity types are reversed.

What is claimed is:

1. An insulated gate bipolar transistor, comprising:

a first semiconductor layer of a first conductivity type;

a second semiconductor layer of a second conductivity type adjoining said first semiconductor layer;

a third semiconductor layer of said first conductivity type formed in said second semiconductor layer, a junction between said second semiconductor layer and said third semiconductor layer terminating at a surface of said second semiconductor layer;

a fourth semiconductor layer of said second conductivity type formed in said third semiconductor layer, a junction between said third semiconductor layer and said fourth semiconductor layer terminating at a surface of said third semiconductor layer;

a fifth semiconductor layer of said first conductivity type formed in said second semiconductor layer to surround a region of said second semiconductor layer in which said third semiconductor layer is formed, a junction between said second semiconductor layer and said fifth semiconductor layer terminating at a surface of said second semiconductor layer;

a sixth semiconductor layer of said first conductivity type formed in said second semiconductor layer without any semiconductor layers of said second conducting type formed therein, a junction between said second semiconductor layer and said sixth semiconductor layer terminating at said surface of said second semiconductor layer, said sixth semiconductor layer being located between said fifth semiconductor layer and said third semiconductor layer;

a gate electrode formed, via a gate insulating film, at least over a channel region provided by a surface of said third semiconductor layer in a portion of said third semiconductor layer between said second semiconductor layer and said fourth semiconductor layer;

a source electrode in electrical contact with said third semiconductor layer, said fourth semiconductor layer, and said sixth semiconductor layer; and a drain electrode for supplying a drain current through said first semiconductor layer;

said second semiconductor layer having an impurity concentration and a layer thickness such that, when a voltage is applied across said drain electrode and said source electrode to propagate a depletion region from a p-n junction between said third semiconductor layer and said second semiconductor layer through said second semiconductor layer toward said first semiconductor layer, a critical electric field is established that causes generation of a groat number of electron-hole pairs due to impact ionization of carriers in or near said second semiconductor layer, thereby causing an avalanche breakdown and conduction between said drain electrode and said source electrode, at an applied voltage lower than a drain-source voltage at which said depletion region reaches said first semiconductor layer through said second semiconductor layer, said applied voltage being equal to or lower than a critical voltage that causes generation of a great number of electron-hole pairs due to impact ionization of carriers in or near said second semiconductor layer below a p-n junction between said fifth semiconductor layer and said second semiconductor layer.

2. An insulated gate bipolar transistor according to claim 1, further comprising:

a seventh semiconductor layer of said second conductivity type disposed at or near a p-n junction between said first semiconductor layer and said second semiconductor layer, said seventh semiconductor layer having an impurity concentration higher than an impurity concentration of said second semiconductor layer, and said seventh semiconductor layer being patterned so as to leave a contact surface between said first semiconductor layer and said second semiconductor layer for transferring carriers therethrough.

3. An insulated gate bipolar transistor according to claim 2, wherein said seventh semiconductor layer has a cyclically repeated pattern at or near said p-n junction between said first semiconductor layer and said second semiconductor layer.

4. An insulated gate transistor according to claim 2, wherein said seventh semiconductor layer has a pattern of a net.

5. An insulated gate transistor according to claim 2, wherein said seventh semiconductor layer has a pattern of stripes.

6. An insulated gate transistor according to claim 1, wherein said drain electrode is in electrical contact with said first semiconductor layer only.

7. An insulated gate bipolar transistor, comprising:

a first semiconductor layer of a first conductivity type;

a second semiconductor layer of a second conductivity type adjoining said first semiconductor layer;

a third semiconductor layer of the first conductivity type formed in said second semiconductor layer, a junction between said second semiconductor layer and said third semiconductor layer terminating at a surface of said second semiconductor layer which does not adjoin said first semiconductor layer;

a fourth semiconductor layer of said second conductivity type formed in said third semiconductor layer, a junction between said third semiconductor layer and said fourth semiconductor layer terminating at a surface of said third semiconductor layer;

a fifth semiconductor layer of said first conductivity type formed in said second semiconductor layer to surround a region of said second semiconductor layer in which said third semiconductor layer is formed, a junction between said second semiconductor layer and said fifth semiconductor layer terminating at a surface of said second semiconductor layer which does not adjoin said first semiconductor layer;

a sixth semiconductor layer of said first conductivity type formed in said second semiconductor layer without any semiconductor layers of said second conducting type formed therein, a junction between said second semiconductor layer and said sixth semiconductor layer terminating at said surface of said second semiconductor layer, said sixth semiconductor layer being located between said fifth semiconductor layer and said third semiconductor layer;

a gate insulating film formed over at least a channel region provided by a surface of said third semiconductor layer in a portion of said third semiconductor layer between said second semiconductor layer and said fourth semiconductor layer;

a gate electrode formed on said gate insulating film;

a source electrode in electrical contact with said third semiconductor layer, said fourth semiconductor layer, and said sixth semiconductor layer; and a drain electrode in electrical contact with said first semiconductor layer;

an impurity concentration of said second semiconductor layer and a layer thickness of said second semiconductor layer between said first semiconductor layer and said third semiconductor layer both being such that an avalanche breakdown and conduction is caused from said drain electrode to said source electrode when a first reverse bias voltage is applied across said drain electrode and said source electrode, said first reverse bias voltage being lower than a second reverse bias voltage at which a depletion region in said second semiconductor layer extends from said third semiconductor layer to said first semiconductor layer.

8. An insulated gate bipolar transistor according to claim 7, wherein said impurity concentration and said layer thickness of said second semiconductor layer are such that said first reverse bias voltage is lower than or equal to a third reverse bias voltage at which an avalanche breakdown and conduction is caused from said second semiconductor layer to said fifth semiconductor layer.

9. An insulated gate bipolar transistor according to claim 7, further comprising:

a seventh semiconductor layer of said second conductivity type disposed at or near a p-n junction between said first semiconductor layer and said second semiconductor layer, said seventh semiconductor layer having an impurity concentration higher than an impurity concentration of said second semiconductor layer, and said seventh semiconductor layer being patterned so as to leave a contact surface between said first semiconductor layer and said second semiconductor layer for transferring carriers therethrough.

10. An insulated gate bipolar transistor according to claim 9, wherein said seventh semiconductor layer has a cyclically repeated pattern at or near said p-n junction between said first semiconductor layer and said second semiconductor layer.

11. An insulated gate transistor according to claim 9, wherein said seventh semiconductor layer has a pattern of a net.

12. An insulated gate transistor according to claim 9, wherein said seventh semiconductor layer has a pattern of stripes.

13. An insulated gate transistor according to claim 7, wherein said drain electrode is in electrical contact with said first semiconductor layer only.

14. An insulated gate transistor according to claim 8, wherein said drain electrode is in electrical contact with said first semiconductor layer only.

* * * * *